(12) United States Patent
Van Der Avoird et al.

(10) Patent No.: US 12,493,129 B2
(45) Date of Patent: Dec. 9, 2025

(54) DYNAMIC RANGE EXTENSION OF SPAD-BASED DEVICES

(71) Applicant: ams International AG, Jona (CH)

(72) Inventors: André Van Der Avoird, AE Eindhoven (NL); Bobby Daniel, JJ Eindhoven (NL); Erik Jan Lous, KE Veldhoven (NL); Jagruth Prasanna Kumar, AK Geldrop (NL)

(73) Assignee: AMS INTERNATIONAL AG, Jona (CH)

( * ) Notice: Subject to any disclaimer, the term of this patent is extended or adjusted under 35 U.S.C. 154(b) by 397 days.

(21) Appl. No.: 18/043,071

(22) PCT Filed: Aug. 26, 2021

(86) PCT No.: PCT/EP2021/073599
§ 371 (c)(1),
(2) Date: Feb. 27, 2023

(87) PCT Pub. No.: WO2022/043429
PCT Pub. Date: Mar. 3, 2022

(65) Prior Publication Data
US 2023/0358902 A1 Nov. 9, 2023

(30) Foreign Application Priority Data
Aug. 28, 2020 (GB) ...................................... 2013584

(51) Int. Cl.
*G01T 1/24* (2006.01)
*G01T 1/17* (2006.01)
(52) U.S. Cl.
CPC .............. *G01T 1/247* (2013.01); *G01T 1/171* (2013.01); *G01T 1/243* (2013.01)

(58) Field of Classification Search
None
See application file for complete search history.

(56) References Cited

U.S. PATENT DOCUMENTS

| | | |
|---|---|---|
| 2016/0284743 A1 | 9/2016 | Mellot et al. |
| 2017/0139041 A1 | 5/2017 | Drader et al. |

(Continued)

FOREIGN PATENT DOCUMENTS

| | | |
|---|---|---|
| CN | 111033759 A | 4/2020 |
| EP | 2546621 A1 | 1/2013 |

(Continued)

OTHER PUBLICATIONS

GB Search Report dated Feb. 24, 2021, GB Application No. 2013584.4, 3 pages.

(Continued)

*Primary Examiner* — Edwin C Gunberg
(74) *Attorney, Agent, or Firm* — MH2 Technology Law Group LLP

(57) ABSTRACT

A radiation-sensitive device is disclosed. The radiation-sensitive device includes: a plurality of single photon avalanche diodes (SPADs), and processing circuitry configured to determine an intensity of incident radiation using at least one of the plurality SPADs. An amount of the SPADs used to determine the intensity of the incident radiation varies in relation to the intensity of the incident radiation. Also disclosed in an associated method of determining an intensity of radiation incident upon such a radiation-sensitive device, and uses of the radiation-sensitive device in an electronic-nose or point-of-care apparatus, or for ambient light sensing.

13 Claims, 4 Drawing Sheets

(56) References Cited

U.S. PATENT DOCUMENTS

2018/0195900 A1*  7/2018  Delic .................... H10F 39/10
2019/0250257 A1   8/2019  Finkelstein et al.
2020/0168748 A1   5/2020  Roehrer
2020/0217965 A1   7/2020  Calder et al.

FOREIGN PATENT DOCUMENTS

EP    3339887 A1      6/2018
EP    3442032 A1 *   2/2019   ......... H01L 27/1446

OTHER PUBLICATIONS

International Search Report dated Jan. 7, 2022, PCT Application No. PCT/EP2021/073599, 11 pages.
Gyongy, I. et al., "Advances in CMOS SPAD sensors for LIDAR applications", Proceedings of SPIE; ISSN 0277-786X; Oct. 4, 2018, vol. 10799, pp. 1079907-1079907, XP060112487.
Chinese Office Action issued in corresponding Chinese Patent Application No. 202180046071.3, dated Jun. 9, 2025, with English language translation, 14 pages.

* cited by examiner

| Base No. Bits | Additional Bits | Maximum Event Count | No. Counters |
|---|---|---|---|
| 2 | 0 | 3 | 256 |
| 2 | 1 | 7 | 64 |
| 2 | 2 | 15 | 16 |
| 2 | 3 | 31 | 4 |
| 2 | minimum of 4 | 63 | 1 |

DYNAMIC RANGE EXTENSION OF SPAD-BASED DEVICES

CROSS-REFERENCE TO RELATED APPLICATIONS

The present application is the national stage entry of International Patent Application No. PCT/EP2021/073599, filed on Aug. 26, 2021, and published as WO 2022/043429 A1 on Mar. 3, 2022, which claims the benefit of priority of Great Britain Patent Application No. 2013584.4, filed on Aug. 28, 2020, the disclosures of all of which are incorporated by reference herein in their entireties.

TECHNICAL FIELD

The present disclosure is in the field of SPAD-based devices for use in measurements requiring a large dynamic range, such as point of care testing, electronic-nose applications, and ambient radiation sensing.

BACKGROUND

Detection of radiation emission with a large Dynamic Range (DR) is required in the field of luminescence and fluorescence radiation sensors. Such sensors may, for example, be used in Point of Care (PoC) testing or Electronic-Nose (E-nose) type of applications, or ambient radiation sensor applications.

In the PoC applications, the presence of biological or chemical substances in fluids or air may be detected by their interaction with complementary substances, which may result in chemi-luminescent or fluorescent radiation emission. The levels of the radiation emitted may dynamically vary between extremely low and high levels. To enable a complete signal capture, a radiation sensor suitable for use in such an application must exhibit a very high dynamic range.

Single Photon Avalanche Diode (SPAD) based photon counters offer the ability to detect very low levels of radiation by counting individual photons. The lowest level of detectable signal may be limited by noise due to a dark-count-rate (DCR). The highest level of detectable signal may be limited by the speed of the SPAD diode itself, by a capacity of a counter associated with the SPAD, and/or by capabilities of associated circuitry. In some applications, this may limit a dynamic range of a SPAD-based sensor.

Some sensor implementations may comprise a large amount of SPADs in order to improve a signal-to-noise ratio at low radiation levels. However, such a large amount of SPADs may result in an increase in associated circuitry, potentially further limiting an achievable dynamic range.

In other prior art sensor implementations, different SPAD areas may be used within a single device in combination with one or more pinholes, in order to adjust a radiation intensity incident upon the different SPAD areas. For example, stacked pin-holes with shifted apertures in a black medium may be implemented to reduce an intensity of incident radiation. Sensors implementing such solutions may be large, may require additional components, and may exhibit a relatively poor signal-to-noise ratio.

It is therefore desirable to provide a radiation sensor having a large dynamic range suitable for PoC testing or E-nose applications, without compromising on signal-to-noise ratio, or requiring additional components or requiring a substantial increase in device size.

It is therefore an aim of at least one embodiment of at least one aspect of the present disclosure to obviate or at least mitigate at least one of the above identified shortcomings of the prior art.

SUMMARY

The present disclosure is in the field of SPAD-based devices, and in particular relates to SPAD-based devices with large dynamic ranges suitable for use in Point of Care testing, Electronic-Nose applications, and ambient radiation sensing applications.

According to a first embodiment of the disclosure, there is provided a radiation-sensitive device comprising: a plurality of SPADs; and processing circuitry configured to determine an intensity of incident radiation using at least one of the plurality SPADs, wherein an amount of the SPADs used to determine the intensity of the incident radiation varies in relation to the intensity of the incident radiation.

Advantageously, a dynamic range of the radiation-sensitive device may be increased because an amount of SPADs used to detect the incident radiation may be adapted towards an overall intensity of the incident radiation, without compromising on a required signal-to-noise ratio at low incident radiation intensity levels, and without incurring a large die size that would be associated with enabling all of the available SPADs to be used for both low and high intensity incident radiation.

For example, at very low incident radiation intensity levels, a large amount of SPADS may be required to ensure an adequate signal-to-noise ratio. However, due to the very low incident radiation intensity level, each SPAD may require only a limited amount of associated circuitry to count SPAD events, e.g. incident photons. In contrast, at relatively high incident radiation intensity levels, it has been recognised that a lower quantity of SPADs may be used to achieve the required signal-to-noise ratio. As such, only a subset of the available SPADs would require associated circuitry capable of counting SPAD events at the relatively high incident radiation intensity levels.

The number of SPADs used to determine the intensity of the incident radiation may vary in inverse proportion to the square of the intensity of the incident radiation.

That is, a majority of the SPADs may be used to determine the intensity of the incident radiation at low incident radiation intensity levels, and a decreasing minority of the available SPADs may be used to determine the intensity of the incident radiation at increasing intensity levels. The decreasing minority of SPADs used may be defined by an inverse quadratic relationship to the intensity of incident radiation. As such, advantageously, circuitry associated with SPADs for measuring a relatively high intensity of incident radiation is required for only a minority of the available SPADs, thus reducing overall size, costs and power consumption, while still providing a sufficient signal-to-noise ratio.

A low amount of SPADs may be used to determine the intensity of the incident radiation when the intensity is high, relative to a high amount of SPADs that may be used to determine the intensity of the incident radiation when the intensity is low.

Advantageously, if only a low amount of SPADs is required for a high intensity of the incident radiation, then only those SPADs require the associated circuitry for counting photon events at such high intensity levels. As such, an overall amount of circuitry may be minimised.

The radiation-sensitive device may comprise a plurality of counters. Each counter may be configured to store a count of photon strikes incident upon an associated SPAD of the plurality of SPADs.

Advantageously, the provision of a counter associated with each SPAD means that the size of the counter may define a maximum radiation intensity that each SPAD can measure, rather than the maximum measurable radiation intensity being defined by a common read-out rate. Beneficially, the size of such counters may be selected to define a maximum radiation intensity that each SPAD can measure. Furthermore, by implementing a radiation-sensitive device having multiple SPADs in a single device with different sizes of associated counters, the device may be configured for a particular desired dynamic range.

Each counter may comprise a base number of bits. Every $2^{2N}$th counter may comprise the base number of bits plus at least N bits.

That is, in some embodiments all counters may have at least two bits. Every fourth counter may have at least 3 bits. Every sixteenth counter may have at least four bits. Every sixty-fourth counter may have at least 5 bits, and so on. Continuing with this example, for radiation intensity levels requiring a counter with five bits, only every sixty-fourth SPAD device may be required to perform the measurement. Furthermore, if the intensity of radiation is such that the five-bit counter is required, then using only one in sixty four SPADs would be sufficient to achieve a required signal-to-noise ratio.

The processing circuitry may be configured to determine the intensity of incident radiation using:
- a first subset of the counters for radiation intensity levels above a threshold; and
- the first subset and a second subset of the counters for radiation intensity levels below the threshold.

The first subset may comprises all counters having the base number of bits plus M bits. The second subset may comprise counters having the base number of bits plus M−1 bits.

For example, the first subset may comprise one in every four counters. As such. In this example only one in every four SPADs would be required for radiation intensity levels above the threshold. The second subset may comprise all other counters, e.g. every other three out of the four counters. As such, all SPADs would be used for radiation intensity levels below the threshold.

The threshold may be defined by at least one of the second subset of counters overflowing.

Continuing with the above example, if one or more of the three out of every four counters in the second subset of counters overflows, then this may be indicative that an intensity of the incident radiation is sufficient that only the first subset of counters are adequately large for measuring the intensity of the incident radiation. As such, a subsequent measurement of the intensity of incident radiation may utilise only the first subset of counters.

The processing circuitry may be configured to determine the intensity of incident radiation using a subset of the counters for radiation intensity levels above a/the threshold.

The threshold may be is defined by a number of bits in a/the subset of counters;

The threshold may be a portion of a counter, e.g. if a counter reaches 25% of a maximum count, 50%, 75%, or the like.

The threshold may additionally or alternatively be defined a user-programmable value. For example, the device may have one or more programmable registers for defining one or more thresholds.

At least one counter may comprise sufficient bits such that the maximum count is defined by a dead time of an associated SPAD.

Advantageously, a maximum achievable dynamic range may be achieved by maximising a size of at least one counter, such that an upper limit on an intensity of radiation is defined by the dead time of an associated SPAD, rather than by the amount of bits in the counter.

The radiation-sensitive device may be configured to have a common read-out time interval for determining a count of photon strikes incident upon each SPAD of the plurality of SPADs.

According to a second aspect of the disclosure, there is provided a method of determining an intensity of radiation incident upon a SPAD-based device, the method comprising varying an amount of SPADs used to determine the intensity of the incident radiation in relation to the intensity of the incident radiation.

Advantageously, application of the method enables a device to implement a large dynamic range, without requiring substantial additional circuitry and without compromising on a required signal-to-noise ratio at low incident radiation intensity levels.

The method may comprise a step of selecting a low amount of SPADs to determine the intensity of the incident radiation when the intensity is high, relative to a high amount of SPADs used to determine the intensity of the incident radiation when the intensity is low.

The intensity may be determined to be high when at least one counter overflows and/or when a counter exceeds a predetermined threshold.

According to a third aspect of the disclosure, there is provided use of a radiation-sensitive device according to the first aspect in a point-of-care testing or diagnostics application, or an electronic-nose application, to determine an intensity of luminescence and/or fluorescence from a specimen.

Detection of light emission with a very large dynamic range is particularly required in such point-of-care testing or diagnostics applications, or electronic-nose applications, because the levels of the chemi-luminescent or fluorescent radiation emitted by interaction between biological or chemical substances and complementary substances may vary dynamically between extreme low and high levels.

According to a fourth aspect of the disclosure, there is provided an electronic-nose or point-of-care apparatus comprising a radiation-sensitive device according to the first aspect, wherein the radiation-sensitive device is configured to determine an intensity of luminescence and/or fluorescence from a specimen.

According to a fifth aspect of the disclosure, there is provided a use of a radiation-sensitive device according to the first aspect in an ambient light sensing application.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE DRAWINGS

These and other aspects of the present disclosure will now be described, by way of example only, with reference to the accompanying drawings, wherein.

DETAILED DESCRIPTION OF THE PREFERRED EMBODIMENTS

It has been recognised that in some applications, to increase a signal-to-noise ratio (SNR) in SPAD-based devices, e.g. to accurately detect very low light levels, it may be beneficial to implement a substantial quantity of SPADs. That is, such devices may implement SPAD-arrays comprising, hundreds or even thousands of SPADs in order to accurately measure an intensity of incident radiation with sufficient SNR.

However, a maximum radiation intensity that can be measured by a given SPAD array may be determined by its saturation level.

Saturation may occur when a photon rate reaches a limit of the rate at which SPAD device itself can perform detection. For example, the fastest rate at which a SPAD-based device can count photo-strike events is determined by a time between photon-strike event and a 'recovery time' of the SPAD. The 'recovery time' is a time required for a given SPAD to recover and be ready again. This is known in the art as the 'dead time'. Depending on the particular quenching circuitry implemented, this recovery time may be in the region of a few 10's of nanoseconds, or longer. For example, for a dead time of 100 nanoseconds, a maximum theoretical photon count per SPAD would be 107 per second.

Saturation may additionally or alternatively occur when circuitry associated with the SPADs, e.g. reading and counting circuitry attached to each SPAD, reaches a limit.

In some examples, every single SPAD has dedicated hardware, e.g. a counter, for registering photon-strike events. This leads to a physical limitation on the maximum measurable signal for a given architecture. For example, a limit on a maximum measurable radiation level by a SPAD-based device may be set by the capabilities of such counters and associated circuitry. In particular, an amount of time any given counter has to aggregate a photo-strike event count, known in the art as a read-our interval, may define a size of a counter associated with a SPAD.

As described above, as the number of SPADs in an array is increased to improve SNR, circuitry needed to keep count of the SPAD measurement also increases accordingly. However, a conflicting requirement is making the SPAD-based device as small as possible, and this therefore drives a corresponding need to make the counters as small as possible.

Figure 1:
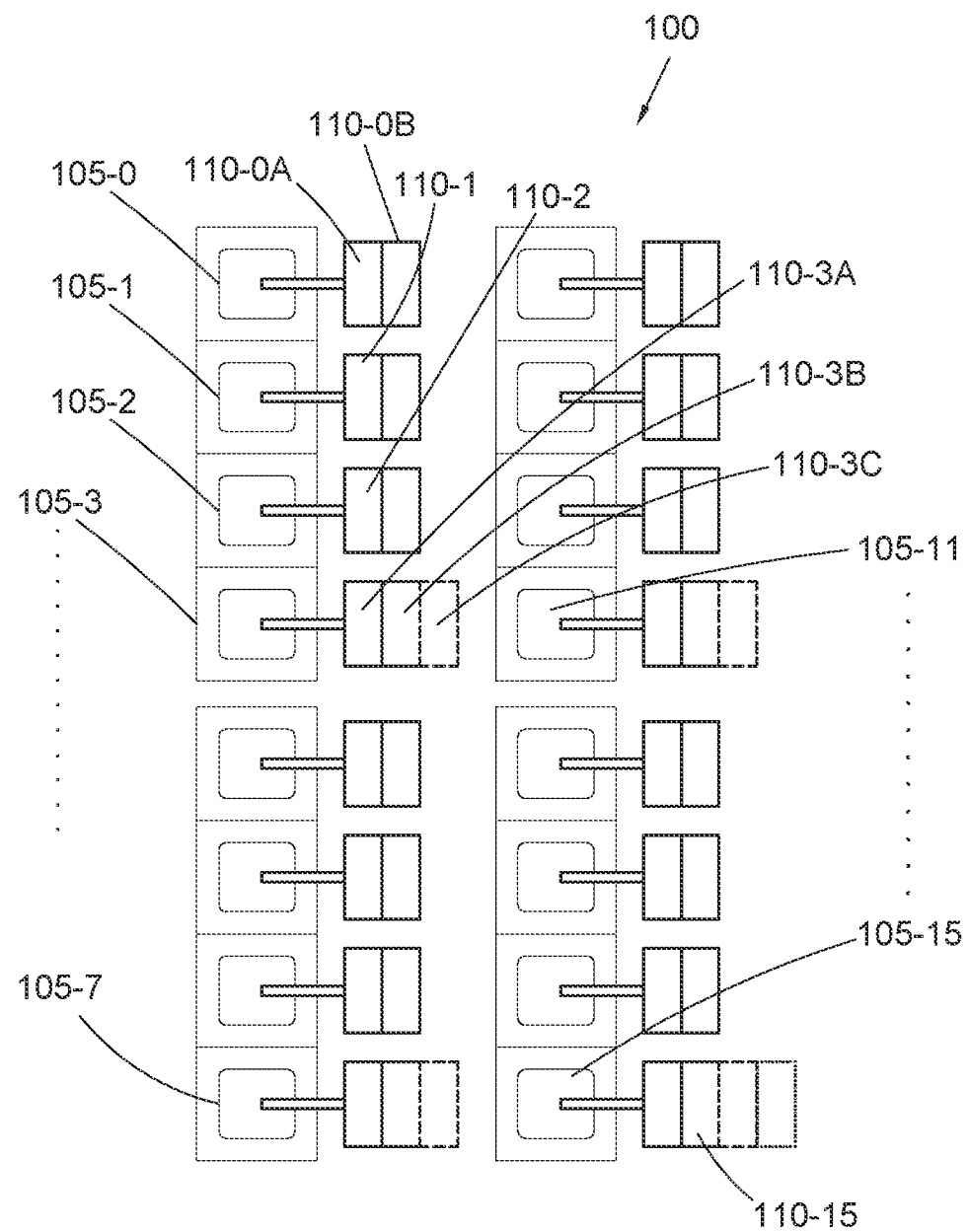
FIG. 1 depicts a SPAD-based sensor architecture according to an embodiment of the disclosure.

FIG. 1 depicts an example of a SPAD-based sensor architecture 100 comprising SPADs and associated counters, according to an embodiment of the invention. The SPAD-based sensor architecture 100 of FIG. 1 provides an example of the disclosure, namely determining an intensity of incident radiation, wherein an amount of SPADS used to make the determination varies in relation to the intensity of the incident radiation.

It will be appreciated that FIG. 1 is an example embodiment only, and is provided for purposes of explaining the principles of the disclosure. For example, other embodiments may comprises substantially larger arrays of SPADs and associated counters. For example, some embodiments may comprise arrays having hundred or even thousands of SPADs. Furthermore, example devices embodying the disclosure, such as sensors suitable for use in PoC or E-nose applications, may comprise multiple arrays of SPADs. Furthermore, a number of bits associated with each SPAD, such as a base number of bits or a maximum number of bits, may vary compared with the example of The SPAD-based sensor architecture 100 of FIG. 1 comprises a plurality of SPADs 105-0 to 105-N. Each SPAD of FIG. 1 has an associated counter 110-0 to 110-N.

The counters 110-0 to 110-N may be coupled to processing circuitry, as described in more detail with reference to FIG. 4. Such processing circuitry may be configured to determine an intensity of incident radiation using at least one of the plurality SPADs 105-0 to 105-N, wherein an amount of the SPADs 105-0 to 105-N used to determine the intensity of the incident radiation varies in relation to the intensity of the incident radiation.

Embodiments of the disclosure are based on the following principle: when multiple SPADs are used together to measure light intensity, a (statistical) signal-to-noise ratio is proportional to the square root of the following two parameters: (1) the number of SPADs used in the measurement and (2) the time-window over which the measurement is taken.

As such, embodiments of the disclosure affectively trade off SNR, which is overabundant at high radiation levels, for dynamic range, as described below in more detail.

It has been recognised that as an intensity of radiation being measured, i.e. a signal level, increases, a number of SPADs required to measure this signal with the required SNR reduces.

As such, and as embodied in the example SPAD-based sensor architecture 100 of FIG. 1, a number of SPADs 105-N with large-sized counters 110-N can be much smaller than the number of SPADs 105-0 with small counters 105-0. In fact, for every added bit of counter-size to measure double the signal, four times fewer SPADs may be required, as explained below If '$Num_{Sp}$' represents the number of SPADs 105-N required to achieve a required SNR at the minimum radiation intensity then, when the radiation intensity level has doubled, it is sufficient to have the data from a number of SPADs equal to $Num_{Sp}/2^2$.

As such, the example embodiment of FIG. 1 represents a SPAD-based sensor architecture 100 that has been designed such that a number of SPADs used to measure a radiation intensity decreases with an inverse quadratic relationship to the magnitude of the radiation level itself.

Continuing with the above example, the total number of SPADs 105-N required by the SPAD-based sensor architecture 100 to achieve the required SNR is "$Num_{Sp}$". The SPAD-based sensor architecture 100 may be configured to have a common read-out time interval for determining a count of photon strikes incident upon each SPAD 105-N of the plurality of SPADs. That is, fixed read-out time interval of "$T_{read}$" may be required to read-out the data from all SPADs 105-N individually. In some example embodiments, the interval $T_{read}$ may be define to enable circuitry to identify and eliminate data from one or more faulty SPADs. All of the SPADs 105-N require associated counters 110-N large enough, e.g. with enough bits, to hold this information without overflowing. The number of bits is denoted "$Nbits_{base}$" is related to a photon strike count as follows:

$$2^{Nbits}base > N_{photons\_MIN} + DCR \qquad \text{Equation (1)}$$

wherein:

$N_{photons\_MIN}$ is a photon-strike count at the lowest signal level; and

DCR is a Dark Count Rate, over time the interval "$T_{read}$".

For example, as depicted in FIG. 1, a SPAD 105-0 has as associated counter 110-0, wherein the counter 110-0 comprises two bits 110-0A, 110-0B. The two bits 110-0A, 110-0B represent $Nbits_{base}$. With two bits, a total binary count of four is achievable. That is, the a SPAD 105-0 may count a total of three photon-strike events before saturating and potentially overflowing, e.g. missing photon strike events or rolling-over, depending upon an chosen implementation.

If the signal level increases due to the intensity of radiation incident upon the SPAD array increasing, such two-bit counters 110-0 would start to saturate or overflow. As such, more bits may be required to prevent saturation or overflowing. However, as described above, it has been recognised that at higher incident-radiation intensity levels, a lower quantity of SPADs may be used to achieve the required signal-to-noise ratio. That is, fewer SPADs 110-N may be needed to detect the increased signal with the required SNR.

For example, if the signal doubles, a number of SPADs 105-N required to measure the signal reduces by a factor four, e.g. $2^2$.

In order to measure the increased signal with the reduced quantity of SPADs, a size of the counter 110-N associated with each SPAD 105-N has to increase accordingly. By increasing a counter by one bit, a maximum count is doubled. That is, by increasing a counter by one bit, a total count corresponding to the measure signal and any dark count contribution is doubled.

For example, in FIG. 1 it can be seen that every fourth SPAD 105-3, 105-7, 105-11, 105-15 has an associated counter comprising three bits. For example, the fourth SPAD 105-3 has an associated counter 110-3 comprising three bits 110-3A, 110-3B, 110-3C. As such, the fourth SPAD 105-3 can count a total of seven photon-strike events, e.g. 23-1, before saturating or overflowing.

That is, given no change in noise level, a signal level at which the counters 110 saturate is at least doubled by adding an additional bit. Hence, the number of SPADs required to measure the intensity of incident radiation is reduced by a factor 4, every time a bit is added to the counters 110-N associated with the SPADs 105-N.

Hence, the described architecture requires that the base number of bits required, $Nbits_{base}$, e.g. the minimum counter size of all $Num_{Sp}$ SPADs, is sufficient to support two times a minimum signal level. This can be described by Equation 2, wherein:

$$2^{Nbits}base = 2 \cdot N_{photons\_MIN} + DCR \qquad \text{Equation (2)}$$

That is, in embodiments of the disclosure, every one in four SPADs 105-N will require one extra bit in an associated counter 110-N.

Turning again to the example embodiment of FIG. 1, if can be seen that all SPADs 105-0 to 105-N have associated counters 110-0 to 110-N with "$Nbits_{base}$" as a base number of bits Only one fourth of the SPADs, e.g. SPAD 105-3, 105-7, 105-11, 105-15 comprise one extra bit in their associated counters 110-3, 110-7, 110-11, 110-15. That is, each of the counters 110-3, 110-7, 110-11, 110-15 comprise at least three bits.

One-sixteenth of the SPADs, e.g. SPAD 110-15 will have two extra bits. That is, SPAD 110-15 comprises at least four bits.

For purposes of simplicity, the SPAD-based sensor architecture 100 of FIG. 1 is depicted with only 16 SPADs 105-0 to 105-N, each with an associated counter 110-0 to 110-N. it will be appreciated that for larger arrays of SPADs, the above-described sequence would continue. That is, one sixty-fourth of the SPADs 105-0 to 105-N would have three extra bits, e.g. 5 bits in total, and so on.

As such, a SPAD-based sensor architecture 100 implemented according to the embodiment of FIG. 1 can meet a SNR requirement as an intensity of incident radiation increases and progressively less SPADs are used.

Therefore, an effective dynamic range of such a SPAD-based sensor architecture is increased within the constraints imposed by size and power limitation. That is, the disclosed SPAD-based sensor architecture 100 maximises an achievable dynamic range, while maintaining sufficient SNR, without exceeding die-size and/or power constraints.

Figure 2:
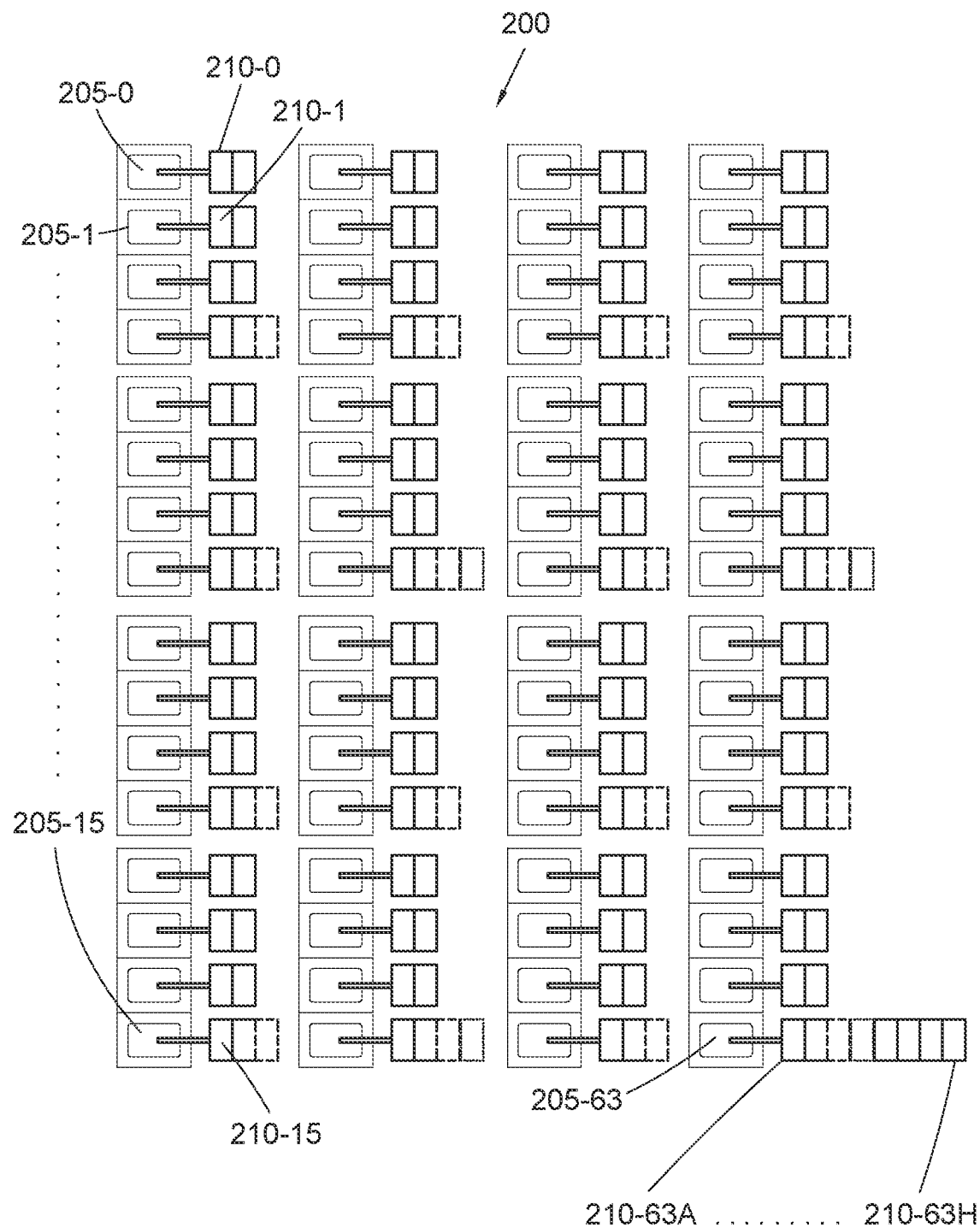
FIG. 2 depicts a further SPAD-based sensor architecture according to an embodiment of the disclosure.

FIG. 2 depicts a further SPAD-based sensor architecture 200 according to an embodiment of the disclosure. The SPAD-based sensor architecture 200 of FIG. 2 shares many of the same features as the SPAD-based sensor architecture 100 of FIG. 1, and thus such features are not described in detail for purposes of brevity. However, for purposes of example, an array of sixty-four SPADs 205-0 to 205-N and associated counters 210-0 to 210-N are shown. The above described principles are implemented, wherein: a base number of bits for all counters is two bits, every fourth SPAD has an associated counter comprising one additional bit and every sixteenth SPAD has an associated counter comprising two additional bits, e.g. four bits in total.

When a number of required SPADs becomes one or less, it can be inferred that all radiation intensities above this level require only one SPAD to have reliable signal read-out, e.g. an adequate signal-to-noise ratio. Thus, in some embodiments this final SPAD may have an associated counter with as large a capacity as needed to support the largest dynamic range possible. In this case, the counter size can be made large enough such that a maximum count bottleneck becomes the speed of the SPAD diode itself, i.e. the above-described dead time.

Referring again to the example embodiment of FIG. 2, it can be seen that the sixty-fourth SPAD 205-63 has an associated counter 210-63 having:

a base number of bits 210-63A, 210-63B of 2 four additional bits 210-63C, 210-63D, 210-63E, 210-63F in accordance with the above described sequence an example two additional bits 210-63G, 210-63H to maximise a dynamic range of the SPAD-based sensor architecture 200.

Figure 3:
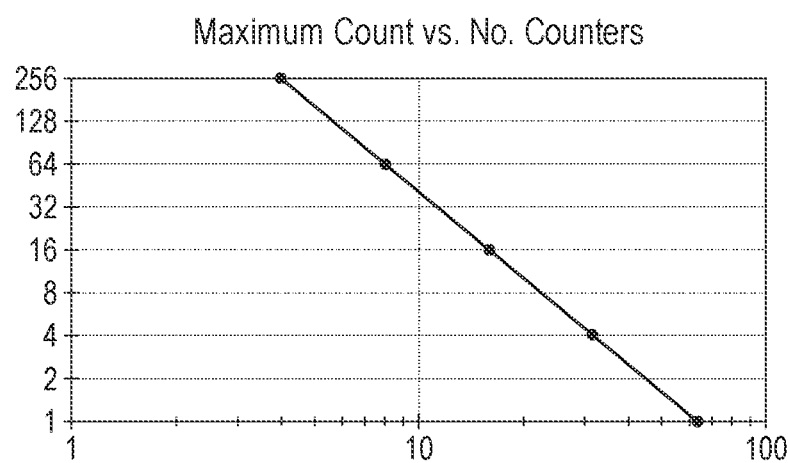
FIG. 3 depicts a relationship between a size of each counter and a quantity of each counter-size for a SPAD-based sensor architecture according to an embodiment of the disclosure.

FIG. 3 depicts a relationship between a size of each counter and a quantity of each counter for a further SPAD-based sensor architecture, according to an embodiment of the disclosure. In the described example embodiment, the further SPAD-based sensor architecture comprises an array of 256 SPADs and associated counters. A base number of bits $Nbits_{base}$, e.g. the minimum counter size of all SPADs which is sufficient to support two times a minimum signal level, is two. It can be seen that all 256 counters comprise at least two bits. With two bits, each counter can count a total of 3 photon strike events.

One fourth of the 256 counters comprise one additional bit, and thus sixty-four of the counters can count a total of 7 photon strike events.

One sixteenth of the 256 counters comprise two additional bits, and thus sixteen of the counters can count a total of 15 photon strike events.

One sixty fourth of the 256 counters comprise three additional bits, and thus four of the counters can count a total of 31 photon strike events.

That is, every $2^{2N}$th counter comprise the base number of bits plus at N bits.

One of the counters has a minimum of four additional bits, and therefore that one of the counters can count a total of 63 photon strike events. As described above with reference to FIG. 2, when the number of required SPADs becomes one or less, in some embodiments this final SPAD may have an associated counter with as large a capacity as needed to support the largest dynamic range possible.

The graph in FIG. 3, which has logarithmic scales on both axes, depicts a relationship between a number of counters and a number of bits each counter comprises, wherein the number of counters corresponds to the number of SPADs used. The graph shows, for example, how all 256 counters comprise 2-bits capable of counting to 4, whereas only 4 of the counters comprise as many as 4 bits capable of counting up to 15 photon-strike events. That is, in some embodiments a number of SPADs used to determine an intensity of the incident radiation varies with an inverse quadratic relationship to the intensity of the incident radiation. As such, a majority of the SPADs may be used to determine the intensity of the incident radiation at low incident radiation intensity levels, and decreasing minority of the available SPADs may be used to determine the intensity of the incident radiation at increasing intensity levels.

Figure 4:
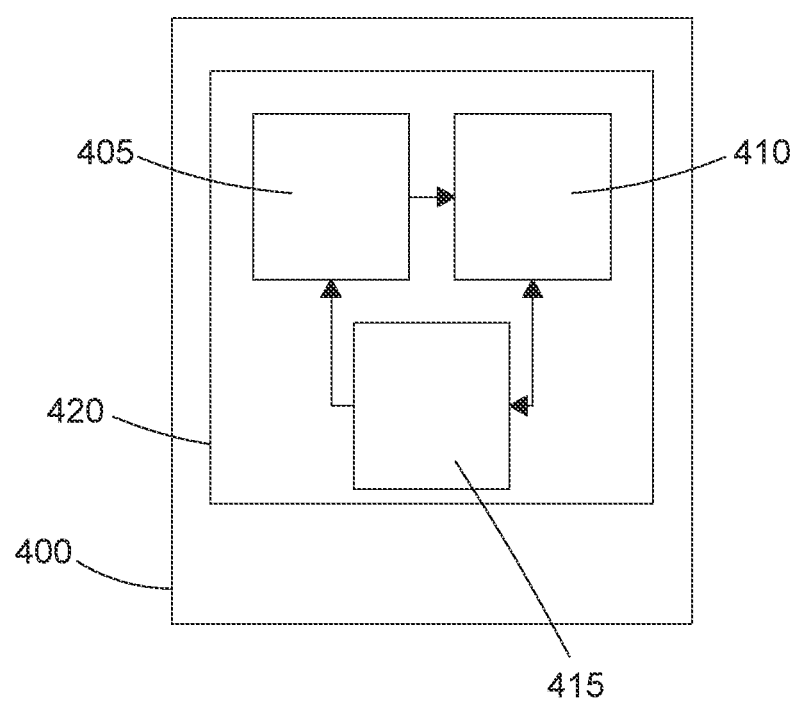
FIG. 4 depicts a radiation-sensitive device according to an embodiment of the invention.

FIG. 4 depicts an apparatus 400 comprising a radiation-sensitive device 420 according to an embodiment of the invention. In some example embodiments, the apparatus 400 may be an apparatus for a Point of Care (PoC) testing or Electronic-Nose (E-nose) type of application, or an ambient radiation sensor application.

The radiation-sensitive device 420 comprises a plurality of SPADs 405. The plurality of SPADs 405 may be arranged as one or more arrays of SPADs 405.

The radiation-sensitive device 420 also comprises a plurality of counters 410. Each counter of the plurality of counters 410 is associated with a SPAD of the plurality of SPADs 405, as described above with reference to FIGS. 1 and 2. The SPADs 405 and the associated counters 410 may be arranged in accordance with SPAD-based sensor architectures 100, 200 of FIGS. 1 and 2, e.g. wherein every $2^{2N}$th counter 410 comprise the base number of bits plus at N bits.

The radiation-sensitive device 420 also comprises processing circuitry 415. In some embodiments, the processing circuitry 415 may be configured to control the plurality of SPADs 405. For example, in some embodiments the processing circuitry 415 may be configured to control quenching of the SPADs 405, and or reset or enabling of one or more of the SPADs 405. The processing circuitry 415 may also be configured to detect one or more faulty SPADs 405.

In some embodiments, the processing circuitry 415 may be configured to read the counters 410. In some embodiments, the processing circuitry 415 may also be configured to reset the counters 410 as required. The processing circuitry 415 may comprise at least one of: a CPU, a microcontroller, a state machine, combinatorial logic, or the like.

In some embodiments, the processing circuitry 415 may be configured to determine an intensity of incident radiation using at least one of the plurality SPADs 405, wherein an amount of the SPADs used to determine the intensity of the incident radiation varies in relation to the intensity of the incident radiation.

In some embodiments, an aperture, a lens, an optical cover, a grating or one or more other optical devices may be disposed between the SPADs 405 and a source of radiation. Such devices may, for example, be configured to focus and/or diffuse radiation incident upon the SPADs 405. In some embodiments, one or more apertures may be stacked to form a stack of shifted apertures, or pin-holes. Such a stack may be disposed on or in close proximity to the SPADs 405. In such embodiments, at least some of the SPADs 405 may be subjected to a lower intensity of incident radiation than other SPADs of the radiation-sensitive device 420. By using such shifted apertures, in combination with any of the above-described techniques, a dynamic range of the radiation-sensitive device 420 may be further increased.

Although the disclosure has been described in terms of particular embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. A radiation-sensitive device comprising:
    a plurality of single photon avalanche diodes (SPADs);
    a plurality of counters, wherein each counter of the plurality of counters is associated with an SPAD of the plurality of SPADs and a size of each counter defines a maximum radiation intensity that each SPAD can measure; and
    processing circuitry configured to determine an intensity of incident radiation using at least one of the plurality SPADs, wherein an amount of the SPADs used to determine the intensity of the incident radiation varies in relation to the intensity of the incident radiation.

2. The radiation-sensitive device of claim 1, wherein the number of SPADs used to determine the intensity of the incident radiation varies in inverse proportion to the square of the intensity of the incident radiation.

3. The radiation-sensitive device of claim 1, wherein a low amount of SPADs is used to determine the intensity of the incident radiation when the intensity is high, relative to a high amount of SPADs used to determine the intensity of the incident radiation when the intensity is low.

4. The radiation-sensitive device of claim 1 wherein each counter of the plurality of counters is configured to store a count of photon strikes incident upon an associated SPAD of the plurality of SPADs.

5. The radiation-sensitive device of claim 4, wherein each counter of the plurality of counters comprises a base number of bits, and wherein every $2^{2N}$th counter comprises the base number of bits plus at least N bits.

6. The radiation-sensitive device of claim 4, wherein at least one counter of the plurality of counters comprises sufficient bits such that a maximum count is defined by a dead time of an associated SPAD.

7. The radiation-sensitive device of claim 1, wherein the processing circuitry is configured to determine the intensity of incident radiation using a subset of the plurality of counters for radiation intensity levels above a threshold.

8. The radiation-sensitive device of claim 7, wherein the threshold is defined by:
   a number of bits in a/the subset of counters; and/or
   a user-programmable value.

9. The radiation-sensitive device of claim 1 configured to have a common read-out time interval for determining a count of photon strikes incident upon each SPAD of the plurality of SPADs.

10. An electronic-nose or point-of-care apparatus comprising a radiation-sensitive device according to claim 1, wherein the radiation-sensitive device is configured to determine an intensity of luminescence and/or fluorescence from a specimen.

11. A method of determining an intensity of radiation incident upon a SPAD-based device, the method comprising varying an amount of SPADs used to determine the intensity of the incident radiation in relation to the intensity of the incident radiation, wherein each SPAD is associated with a counter and a size of the counter defines a maximum radiation intensity that each SPAD can measure.

12. The method of claim 11, comprising a step of selecting a low amount of SPADs to determine the intensity of the incident radiation when the intensity is high, relative to a high amount of SPADs used to determine the intensity of the incident radiation when the intensity is low.

13. The method of claim 12 wherein the intensity is determined to be high when at least one counter overflows and/or when a counter exceeds a predetermined threshold.

* * * * *